United States Patent [19]
Mori et al.

[11] Patent Number: 5,225,715
[45] Date of Patent: Jul. 6, 1993

[54] NARROW PULSE ELIMINATING CIRCUIT THROUGH TRANSMISSION OF INPUT PULSE SIGNAL USING WIDE CLOCK PULSE

[75] Inventors: Takehiko Mori; Koichiro Aoyama, both of Tokyo, Japan

[73] Assignee: NEC Corporation, Tokyo, Japan

[21] Appl. No.: 879,310

[22] Filed: May 7, 1992

[30] Foreign Application Priority Data

May 15, 1991 [JP] Japan ................... 3-110037

[51] Int. Cl.⁵ ................ H03K 3/017; H03K 5/13; H03K 7/00; H03K 17/00
[52] U.S. Cl. .................... 307/265; 307/269; 307/272.1; 307/597; 307/603; 307/605; 307/606; 328/63; 328/66; 328/72
[58] Field of Search .......... 307/260, 265, 269, 272.1, 307/597, 602, 603, 605, 606; 328/63, 66, 72

[56] References Cited

U.S. PATENT DOCUMENTS 4,849,702  7/1989  West et al. ............ 307/269
5,003,194  3/1991  Engelhard ............ 307/272.1
5,087,828  2/1992  Sato et al. ............ 307/269
5,095,232  3/1992  Hirano et al. ............ 307/605

Primary Examiner—John S. Heyman
Assistant Examiner—Trong Quang Phan
Attorney, Agent, or Firm—Sughrue, Mion, Zinn, Macpeak & Seas

[57] ABSTRACT

A pulse discriminating circuit discriminates narrow input pulses from an input pulse signal for eliminating output pulses corresponding to the narrow pulses from an output pulse signal thereof, and comprises a delay unit supplied with the input pulse signal for introducing predetermined time delay into propagation of the input pulse signal in synchronism with a two-phase clock signal, and an eliminating unit responsive to output signals of the delay unit and operative to produce the output pulse signal consisting of output pulses corresponding to wide input pulses, wherein the delay unit comprises early stages responsive to the two-phase clock signal for transferring the input pulse signal, and later stages responsive to a transfer signal lower in frequency than the two-phase clock signal for transferring the input pulse signal so that the predetermined time delay is prolonged without increase the stages of the delay unit.

4 Claims, 9 Drawing Sheets

NARROW PULSE ELIMINATING CIRCUIT THROUGH TRANSMISSION OF INPUT PULSE SIGNAL USING WIDE CLOCK PULSE

FIELD OF THE INVENTION

This invention relates to a digital circuit and, more particularly, to a pulse discriminating circuit for eliminating narrow pulses.

DESCRIPTION OF THE RELATED ART

Referring first to FIG. 1 of the drawings, a prior art pulse discriminating circuit comprises a series combination of D-type flip flop circuits FF1, FF2 and FF3, an AND gate AD1, a NOR gate NR1 and an R-S flip flop circuit FF4. An input pulse signal IN1 is supplied to the input node D of the D-type flip flop circuit FF1, and the output nodes Q of the D-type flip flop circuits FF1 and FF2 are respectively coupled with the input nodes D of the D-type flip flop circuits FF2 and FF3. All of the output nodes Q of the D-type flip flop circuits FF1 to FF3 are coupled with the AND gate AD1 and with the NOR gate NR1, and first and second clock signals CLK1 and CLK2 complementary to each other are respectively supplied to first and second clock nodes C1 and C2 of the D-type flip flop circuits FF1 to FF3. The output node of the AND gate AD1 is coupled with the set node S of the R-S flip flop circuit FF4, and the output node of the NOR gate NR1 is coupled with the reset node R of the R-S flip flop circuit FF4.

The circuit arrangement of each of the D-type flip flop circuits FF1 to FF3 is illustrated in FIG. 2, and comprises two memory loops 1a and 1b, and each of the memory loops 1a and 1b is implemented by two inverters IV1 and IV2. The inverters IV2 is of the three-state type, and each inverter IV2 enters high-impedance state in response to logic "1" level at the control node thereof. A transfer gate TG1 is coupled between the input node D and the input node of the inverter IV1 of the memory loop 1a, and an inverter IV3 is coupled with the control node of the inverter IV2 of the memory loop 1a. The transfer gate TG1 and the inverter IV3 are responsive to the first clock signal CLK1, and the first clock signal CLK1 allows the transfer gate TG1 to turn on or the inverter IV3 to supply logic "1" level to the control node of the inverter IV2. A three state inverter IV4 and an inverter IV5 are provided in association with the memory loop 1b, and the three state inverter IV4 is coupled between the inverters IV1 of the two memory loops 1a and 1b. The inverter IV5 is coupled with the control node of the inverter IV2 for supplying logic "1" level thereto, and the inverters IV4 and IV5 are responsive to the second clock signal CLK2. An inverter IV6 is further coupled between the inverter IV1 of the memory loop 1b and the output node Q, and an input signal is transferred from the input node D through the memory loops 1a and 1b to the output node Q. Namely, when the first clock signal CLK1 goes up to a high voltage level corresponding to logic "1" level, the transfer gate TG1 turns on to relay the data bit to the memory loop 1a, and a data bit is latched by the memory loop 1a. After the first clock signal CLK1 is recovered to a low voltage level corresponding to logic "0" level, the three state inverter IV2 is released from the high-impedance state, and the data bit is stored in the memory loop 1a. The data bit thus stored in the memory loop 1a is transferred to the memory loop 1b when the second clock signal CLK2 goes up to the high voltage level. The second clock signal CLK2 of the low voltage level cuts the memory loop 1b from the memory loop 1a, and allows the memory loop 1b to supply the data bit through the inverter IV6 to the output node Q. Thus, each D-type flip flop circuit FF1, FF2 or FF3 latches a data bit in synchronism with the first clock signal CLK1, and delivers the data bit therefrom in synchronism with the second clock signal CLK2.

The first and second clock signals CLK1 and CLK2 thus supplied to the D-type flip flop circuits FF1 to FF3 are produced from a basic clock signal, and are never simultaneously kept in the high voltage level as shown in FIG. 3. Namely, assuming now that the basis clock signal is lifted to the high voltage level at time t1, the second clock signal CLK2 firstly goes down at time t2, and the first clock signal CLK1 is lifted to the high voltage level at time t3. On the other hand, if the basic clock signal goes down to the low voltage level at time t4, the first clock signal CLK1 is decayed at time t5, and the second clock signal CLK2, thereafter, is lifted to the high voltage level at time t6. Thus, the first and second clock signals CLK1 and CLK2 are never overlapped in the high voltage level, and, for this reason, data bits are sequentially transferred from the memory loop 1a to the memory loop 1b without any collision between the data bits.

Description is hereinbelow made on the circuit behavior of the prior art pulse discriminating circuit with reference to FIG. 4. Assuming now that the input pulse signal IN1 rises at time t11, the input pulse signal IN1 is latched in the memory loop 1a of the first D-type flip flop circuit FF1 in synchronism with the first clock signal CLK1 at time t12, and is relayed to the memory loop 1b in synchronism with the memory loop 1b of the first D-type flip flop circuit FF1 at time t13. Therefore, the output signal of the D-type flip flop circuit FF1 is lifted to the high voltage level at time t13. The output signal of the first D-type flip flop circuit FF1 is latched by the memory loop 1a of the second D-type flip flop circuit FF2 in synchronism with the first clock signal CLK1 at time t14, and is relayed to the memory loop 1b in synchronism with the second clock signal CLK2 at time t15. Then, the output signal of the second D-type flip flop circuit FF2 is lifted to the high voltage level at time t15. The output signal of the second D-type flip flop circuit FF2 is also latched by the memory loop 1a of the third D-type flip flop circuit FF3 in synchronism with the first clock signal CLK1 at time t16, and is transferred to the memory loop 1b of the third D-type flip flop circuit FF3 in synchronism with the second clock signal CLK2 at time t17. Since the input pulse signal IN1 remains in the high voltage level, all of the D-type flip flop circuits FF1 to FF3 shift the output signals thereof to the high voltage level corresponding to logic "1" level, and the AND gate AD1 shifts the output signal thereof to the high voltage level. Since the NOR gate NR1 has already shifted the output signal thereof to the low voltage level, the R-S flip flop circuit FF4 is set with the output signal of the AND gate AD1 so as to lift the output signal thereof to the high voltage level. Thus, if the input pulse signal IN1 remains in the high voltage level over a predetermined time period three times as long as the pulse-repetition period tcyc of the first and second clock signals CLK1 and CLK2, the prior art pulse discriminating circuit shifts the output signal to the high voltage level.

The input pulse signal IN1 continues to remain in the low voltage level over the predetermined time period, and all of the D-type flip flop circuits FF1 to FF3 shift the output signals thereof to the low voltage level. Then, the NOR gate NR1 resets the R-S flip flop circuit FF4, and the R-S flip flop circuit FF4 shifts the output signal thereof to the low voltage level. However, if the input pulse signal IN1 is merely lifted to the high voltage level from time t20 to t21, the time period between times t20 and t21 are shorter than the predetermined time period three times as long as the pulse-repetition period tcyc, the first D-type flip flop circuit FF1 shifts the output signal thereof to the low voltage level before time t22, and the AND gate AD1 can not set the R-S flip flop circuit FF4. Therefore, the output signal of the R-S flip flop circuit FF4 never shifts the output signal thereof to the high voltage level, and the prior art pulse discriminating circuit eliminates the output pulse indicative of the narrow input pulse from the output signal thereof.

The predetermined time period is variable in the prior art pulse discriminating circuit. If three D-type flip flop circuits FF5, FF6 and FF7 are added to the series combination of the D-type flip flop circuits FF1 to FF3 as shown in FIG. 5, the predetermined time period is six times as long as the pulse-repetition period tcyc, and the pulse discriminating circuit monitors the input pulse signal IN1 to see whether or not an input pulse is equal to or longer than the predetermined time period six times as long as the pulse-repetition period tcyc. Namely, if the input pulse signal IN1 rises at time t31 and continues over the predetermined time period six times as long as the pulse-repetition period tcyc as shown in FIG. 6, the output signals of the D-type flip flop circuits FF1 to FF3 and FF5 to FF7 are sequentially lifted to the high voltage level, and the AND gate AD1 allows the R-S flip flop circuit FF4 to shift the output signal thereof to the high voltage level at time t32. Therefore, the prior art pulse discriminating circuit discriminates the input pulse between times t31 to t32, and produces the corresponding output pulse. However, an input pulse between times t33 and t34 is narrower than the predetermined time period, and the output signal of the D-type flip flop FF7 still remains in the low voltage level at time t34. This results in that the AND gate AD1 never lifts the output signal thereof, and a corresponding output pulse indicated by broken lines is eliminated from the output signal of the R-S flip flop circuit FF4.

However, a problem is encountered in both prior art pulse discriminating circuits in that the circuit components are proportionally increased together with the predetermined time period. Namely, each of the D-type flip flops corresponds to a unit time period, and the predetermined time period is defined as a multiple of the unit time period. Therefore, the amount of the predetermined time period is depending upon the number of the D-type flip flop circuits coupled in series, and the circuit components are increased with the discriminable input pulse width.

SUMMARY OF THE INVENTION

It is therefore an important object of the present invention to provide a pulse discriminating circuit which can discriminate a wide input pulse with a small number of circuit components.

To accomplish the object, the present invention proposes to decrease the frequency of a clock signal supplied to parts of a timer unit.

In accordance with the present invention, there is provided a pulse discriminating circuit comprising a) a delay unit supplied with an input pulse signal consisting of input pulses for introducing predetermined time delay into propagation of each of the input pulses, and having early stages and later stages coupled in series for producing respective first output signals when the aforesaid each of the input pulses takes place over the predetermined time period, the early stages and the later stages being respectively responsive to combination of first and second clock signals complementary to each other and combination of the first clock signal and a third clock signal lower in frequency than the first and second clock signals, b) a pulse eliminating unit responsive to the first output signals for producing an output pulse forming a part of an output pulse signal, the pulse eliminating unit being prohibited from production of the output pulse in the absence of the first output signals, and c) a divider unit responsive to the first output signals of the early stages and to the first and second clock signals for producing the third clock signal.

BRIEF DESCRIPTION OF THE DRAWINGS

The features and advantages of the pulse discriminating circuit according to the present invention will be more clearly understood from the following description taken in conjunction with the accompanying drawings in which.

DESCRIPTION OF THE PREFERRED EMBODIMENT

Figure 1:
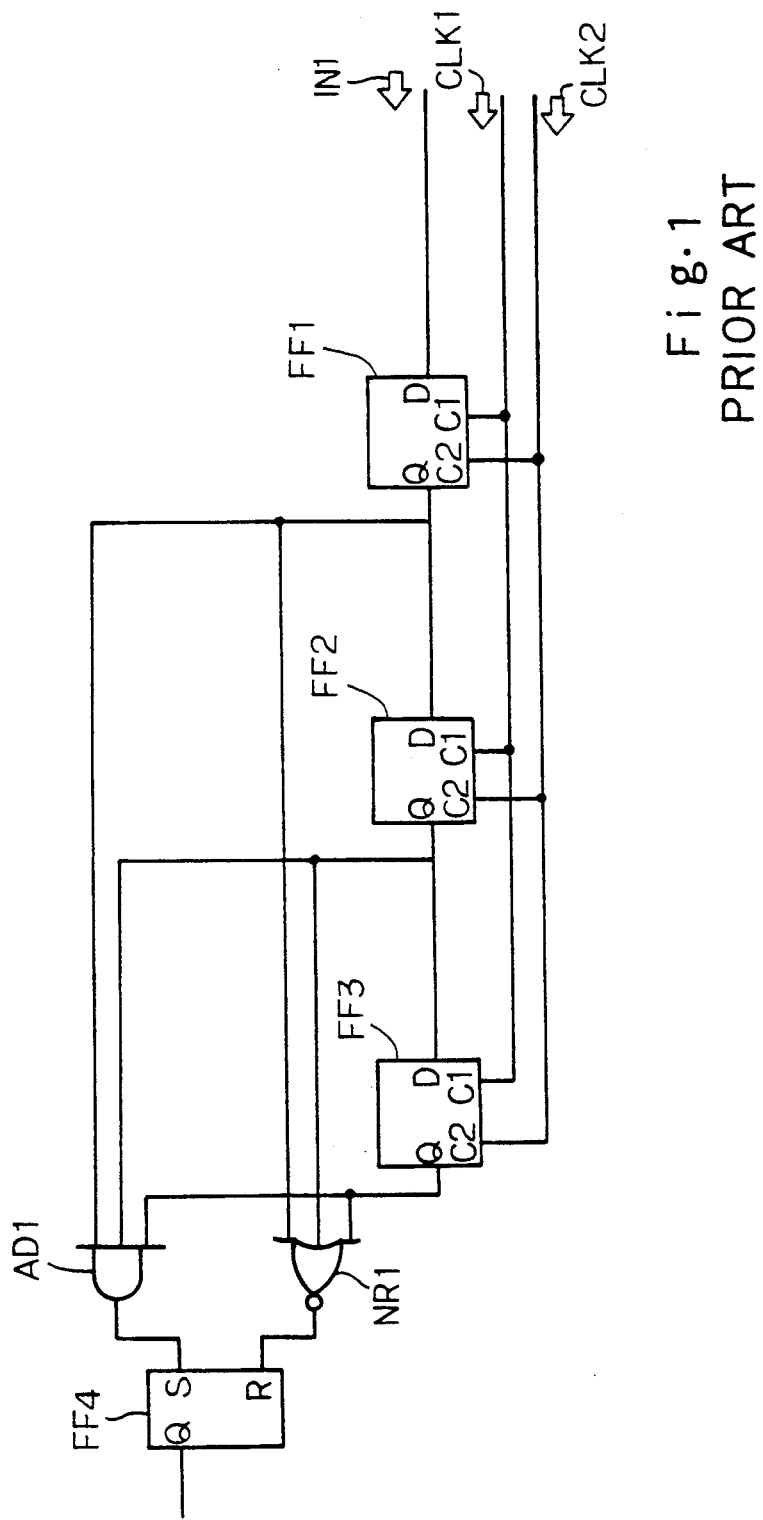
FIG. 1 is a circuit diagram showing the arrangement of the prior art pulse discriminating circuit.
Figure 2:
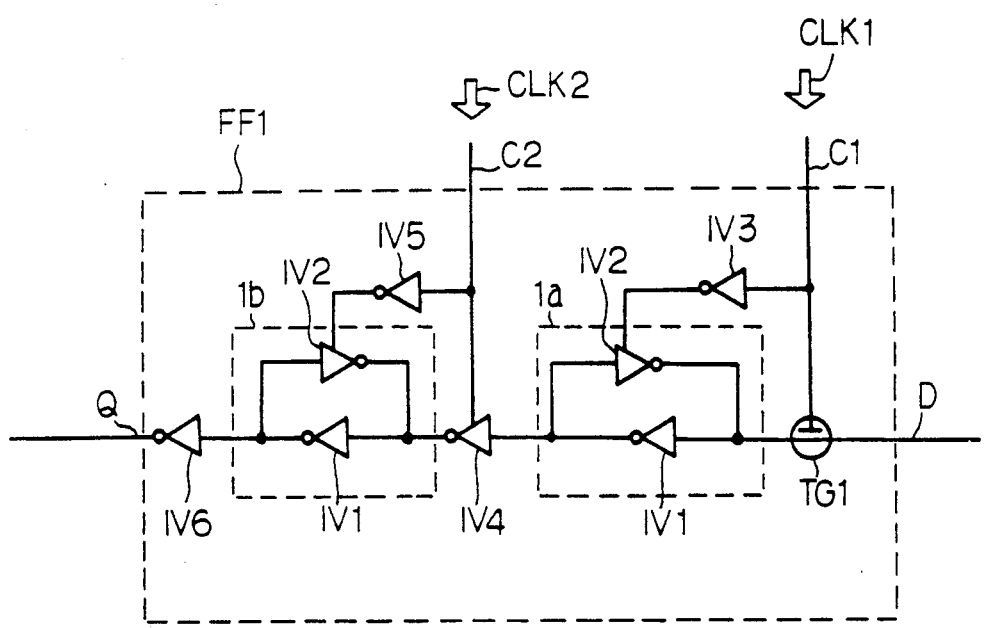
FIG. 2 is a circuit diagram showing the arrangement of a D-type flip flop circuit incorporated in the prior art pulse discriminating circuit.
Figure 3:
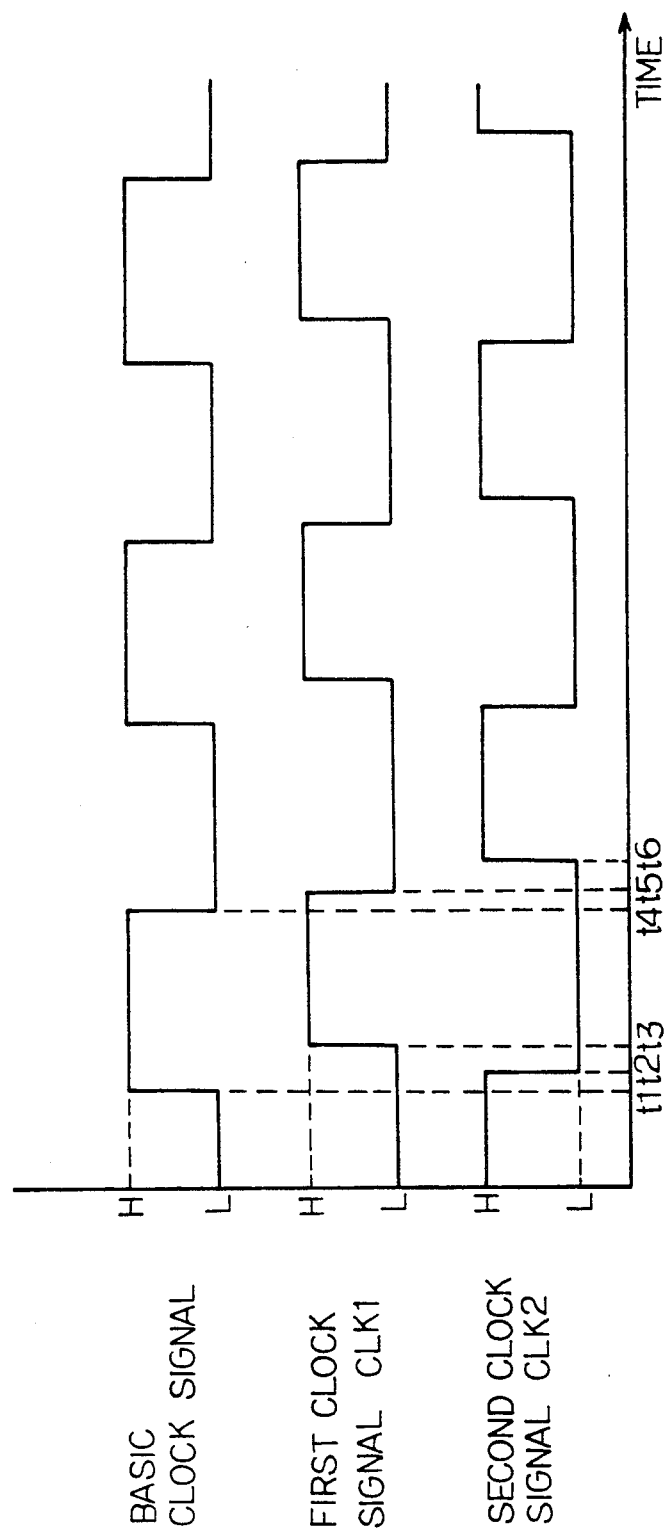
FIG. 3 is a timing chart showing clock signals complementary to each other and used in the prior art pulse discriminating circuit.
Figure 4:
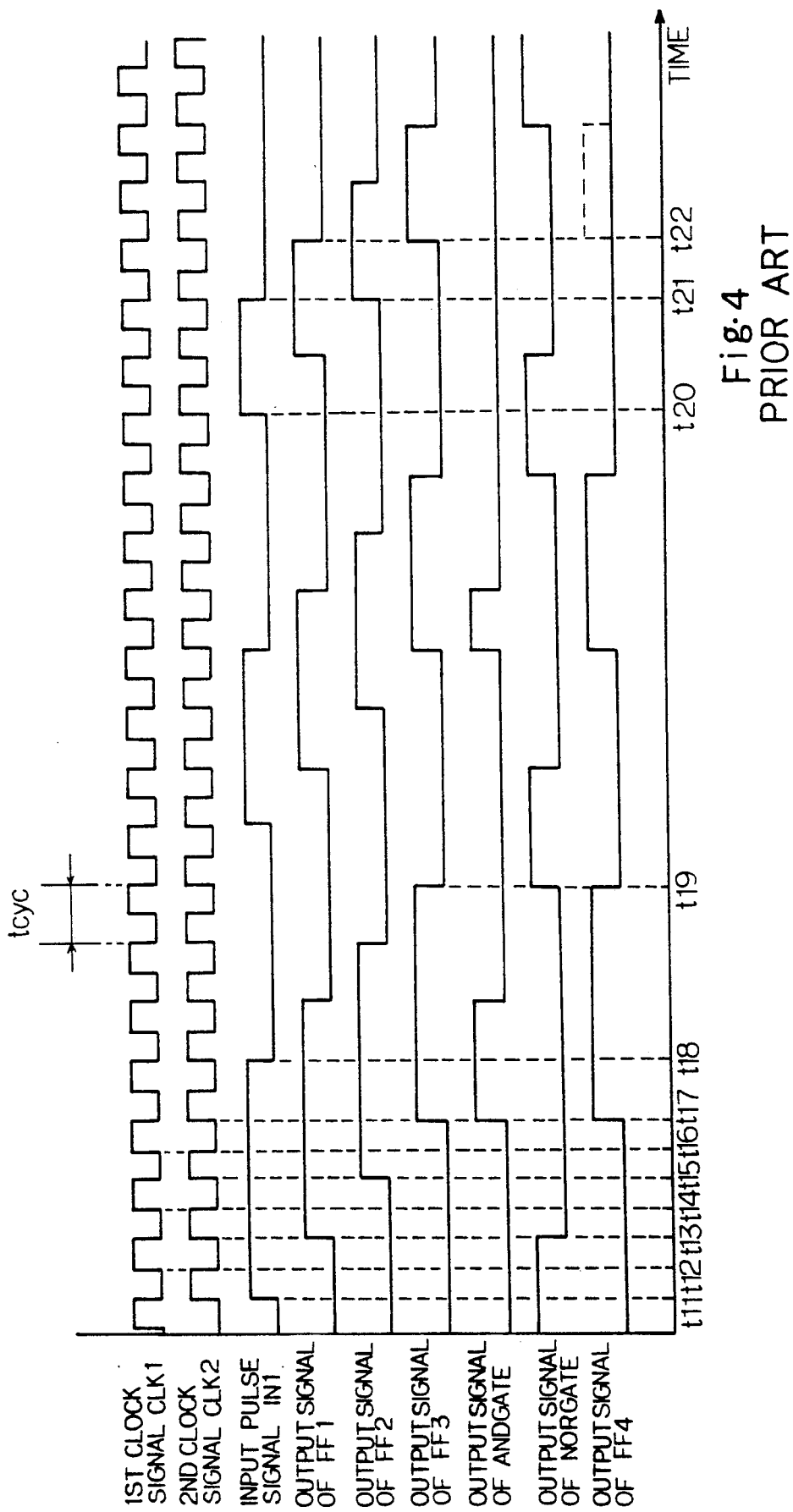
FIG. 4 is a timing chart showing the circuit behavior of the prior art pulse discriminating circuit.
Figure 5:
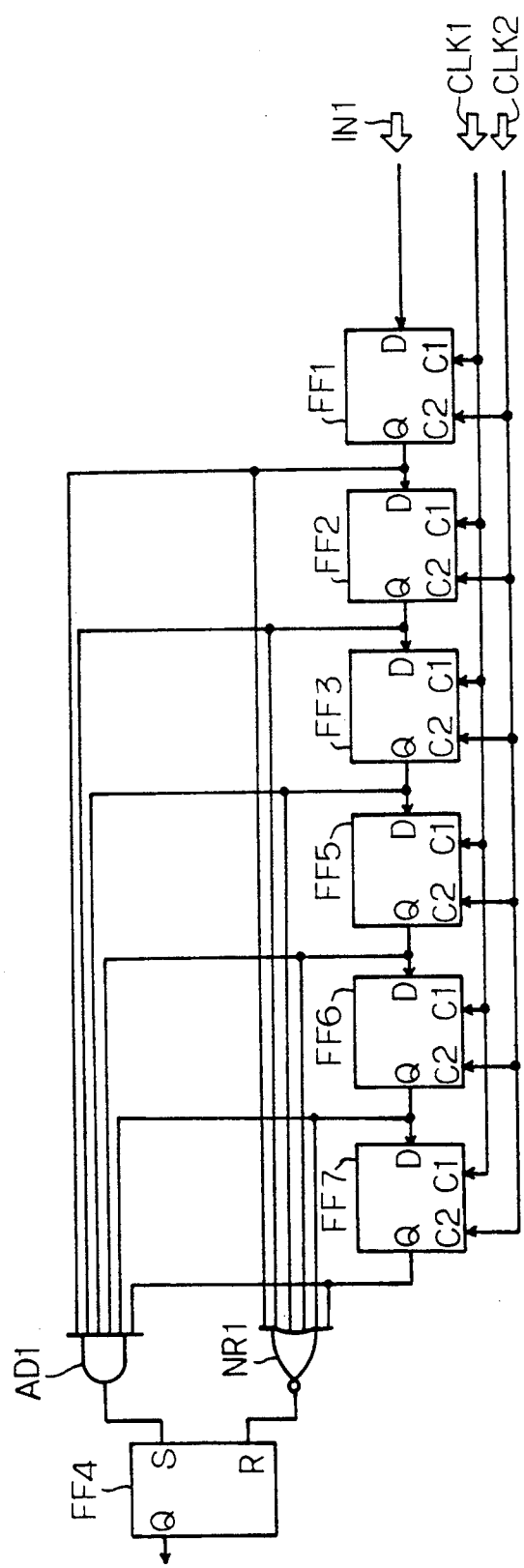
FIG. 5 is a circuit diagram showing the arrangement of the prior art pulse discriminating circuit for discriminating wider input pulse.
Figure 6:
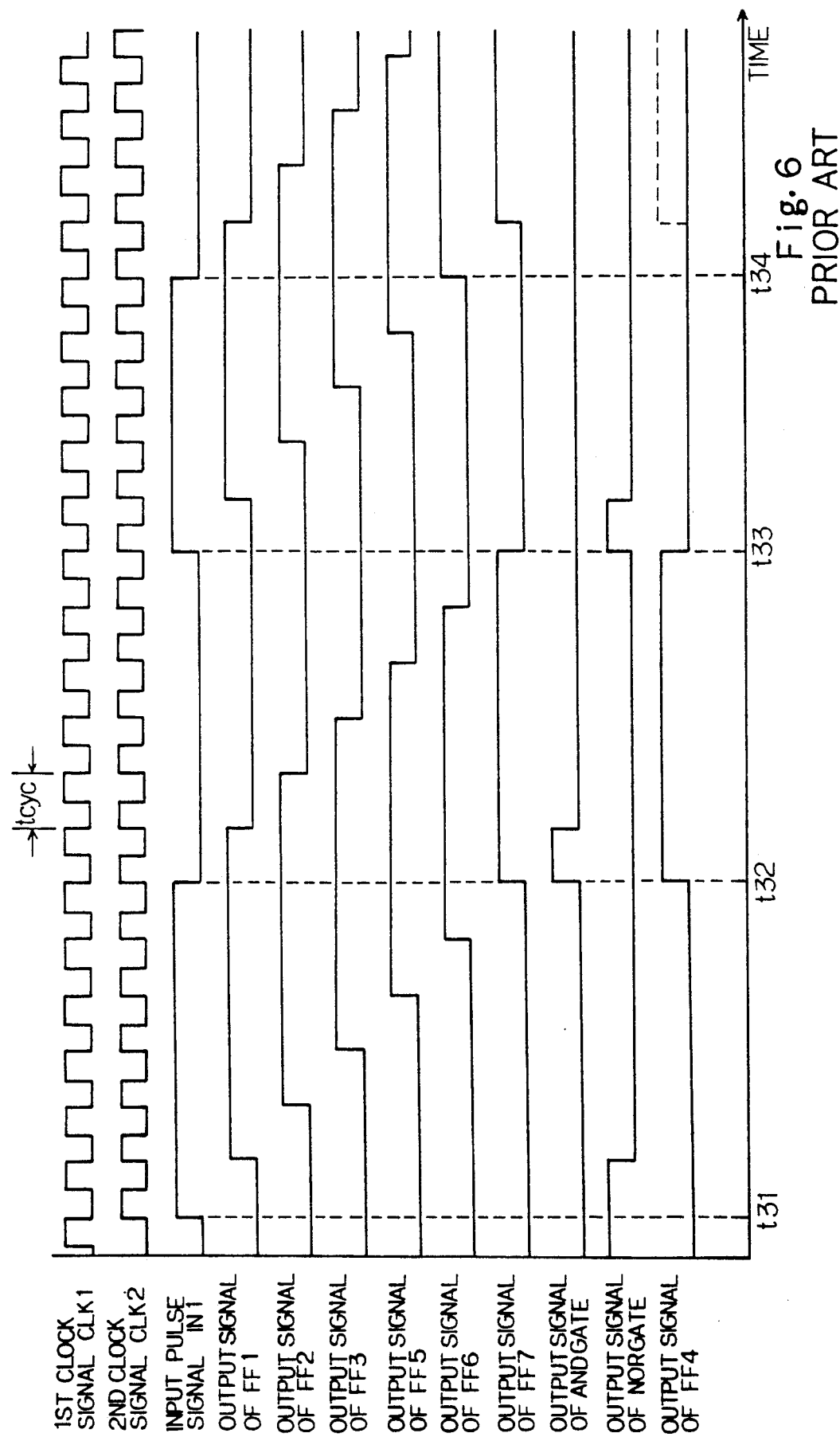
FIG. 6 is a timing chart showing the circuit behavior of the prior art pulse discriminating circuit shown in FIG. 5.
Figure 7:
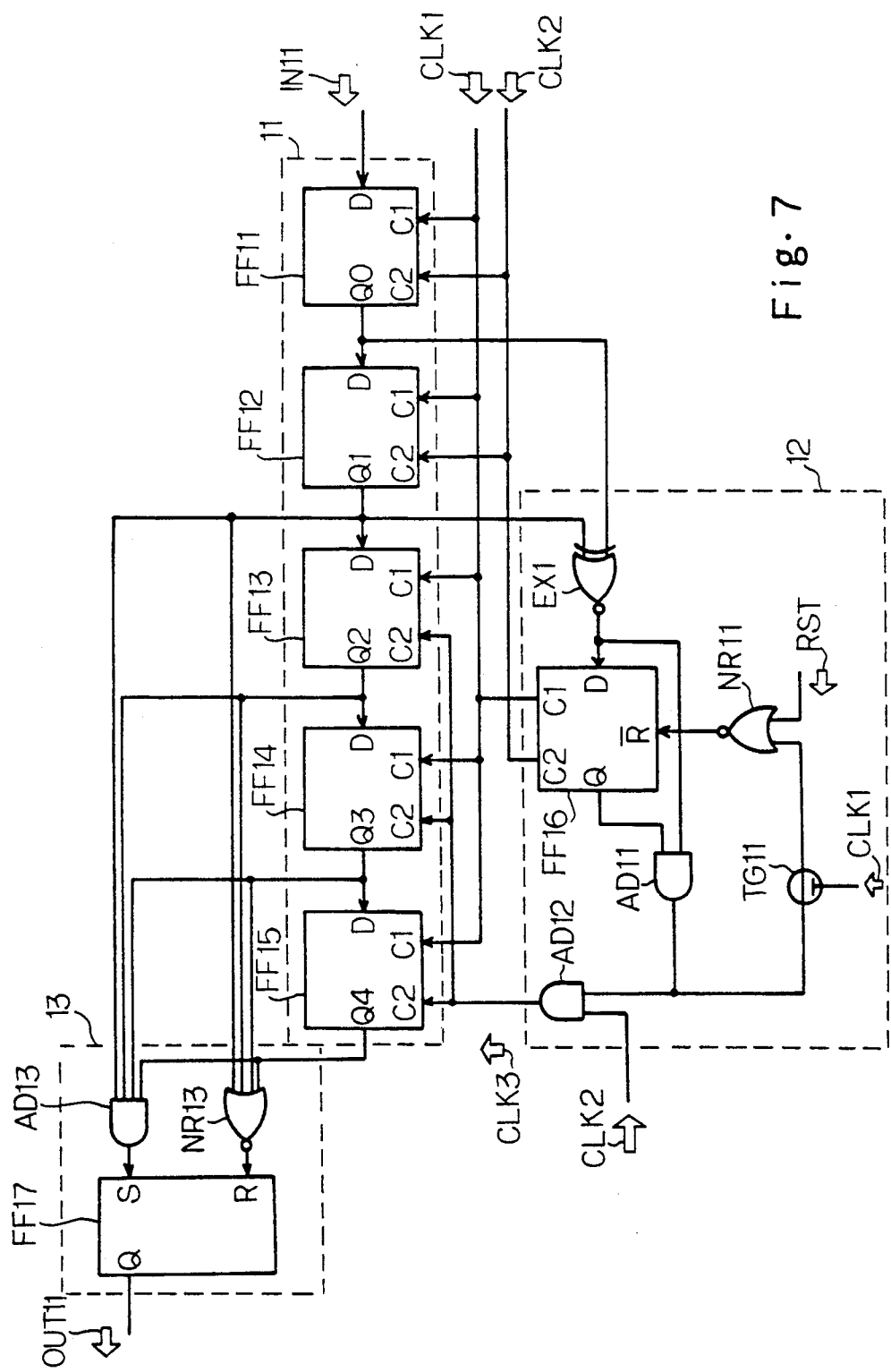
FIG. 7 is a circuit diagram showing the arrangement of a pulse discriminating circuit according to the present invention.

Referring to FIG. 7 of the drawings, a pulse discriminating circuit embodying the present invention largely comprises a delay unit 11, a divider circuit 12 and a pulse eliminating unit 13. The delay unit 11 is implemented by a plurality of D-type flip flop circuits FF11, FF12, FF13, FF14 and FF15 coupled in series, and the D-type flip flop circuits FF11 and FF12 and the D-type flip flop circuits FF13 to FF15 serve as early stages and later stages, respectively. An input pulse signal IN11 is supplied to the input node D of the D-type flip flop circuit FF11, and the output nodes Q0 to Q3 of the D-type flip flop circuits FF11 to FF14 are respectively coupled with the input nodes D of the D-type flip flop circuits FF12 to FF15. A first clock signal CLK1 is supplied to the first clock node C1 of the D-type flip flop circuits FF1 to FF15, and a second clock signal CLK2 is supplied to the second clock nodes C2 of the D-type flip flop circuits FF11 and FF12 serving as the early stages. However, a third clock signal CLK3 is supplied from the divider unit 12 to the second clock nodes C2 of the D-type flip flop circuits FF13 to FF15 serving as the later stages. The first and second clock signals CLK1 and CLK2 are complementary to each other, and are never simultaneously lifted to a high voltage level corresponding to logic "1" level. The third clock signal CLK3 is lower in frequency than the first and second clock signals CLK1 and CLK2 as described hereinlater.

The divider unit 12 comprises an exclusive-NOR gate EX1, a resettable D-type flip flop circuit FF16, a NOR gate NR11, a transfer gate TG11 and two AND gates AD11 and AD12. The resettable D-type flip flop circuit FF16 transfers logic level at the input node D thereof to the output node thereof in synchronism with the first and second clock signals CLK1 and CLK2; however, the resettable D-type flip flop circuit FF16 shifts the output node thereof to the low voltage level or logic "0" level in the presence of logic "0" level at the reset node R thereof as will be described hereinlater. The input nodes of the exclusive-NOR gate EX1 is coupled with the output nodes Q0 and Q1 of the early stages FF11 and FF12, and the output node of the exclusive-NOR gate EX1 is coupled with the input node of the resettable D-type flip flop circuit FF16. The first and second clock nodes C1 and C2 are supplied with the first and second clock signals CLK1 and CLK2, and the input node D and the output node Q are coupled with the input nodes of the AND gate AD11. The output node of the AND gate AD11 is coupled through the transfer gate TG11 to one of the NOR gate NR11, and the other input node of the NOR gate NR11 is supplied with a reset signal RST. The transfer gate TG11 is responsive to the first clock signal CLK1, and the output signal of the AND gate AD11 is NORed with the reset signal RST. While the reset signal RST remains in the high voltage level or logic "1" level, the NOR gate NR11 continuously supplies logic "0" level to the reset node of the resettable D-type flip flop circuit FF16 regardless of the output signal of the AND gate AD11, and the resettable D-type flip flop circuit FF16 fixes the output node thereof to the low voltage level. However, if the reset signal RST goes down to a low voltage level corresponding to logic "0" level, the NOR gate NR11 becomes responsive to the output signal of the AND gate AD11 transferred thereto in synchronism with the first clock signal CLK1, and the resettable D-type flip flop circuit FF16 is enabled or disabled depending upon the output signal of the NOR gate NR11. The output signal of the AND gate AD11 is ANDed with the second clock signal CLK2 by the AND gate AD12, and the AND gate AD12 produces the third clock signal CLK3. The third clock signal CLK3 is distributed to the second clock nodes C2 of the D-type flip flop circuits FF13 to FF15 serving as the later stages.

The divider 12 thus arranged memorizes the logic level at the output node of the exclusive-NOR gate EX1 into the resettable D-type flip flop circuit FF16 in synchronism with the first clock signal CLK1, and the logic level is transferred to the output node Q of the resettable D-type flip flop circuit FF16 in synchronism with the second clock signal CLK2. If the logic level is "1", the AND gate AD11 relays to the AND gate AD12, and the logic level of "1" is distributed to the second clock nodes C2 of the D-type flip flop circuits FF13 to FF15 in synchronism with the second clock signal CLK2. Thus, the logic level of "1" is delivered from the AND gate AD12 with two clock pulses of the second clock signal CLK2, and, for this reason, the third clock signal CLK3 has the pulse width twice as wide as the second clock signal CLK2.

Figure 8:
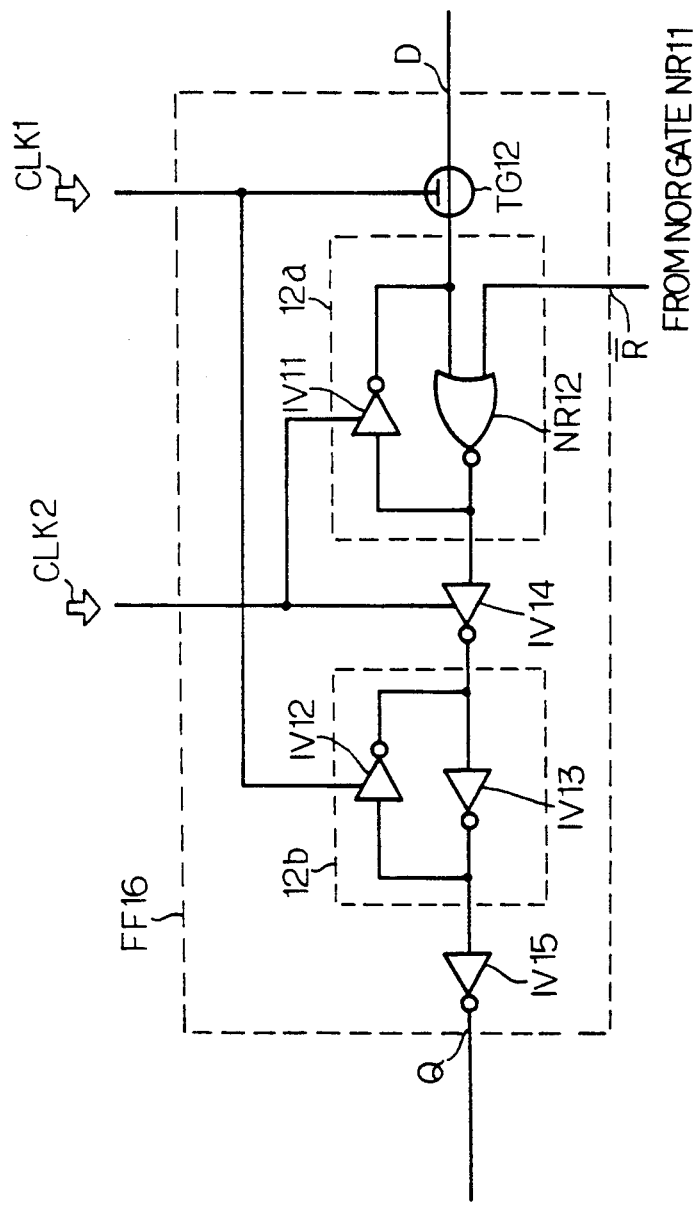
FIG. 8 is a circuit diagram showing the arrangement of a resettable D-type flip flop circuit incorporated in the pulse discriminating circuit shown in FIG. 7.

The circuit arrangement of the resettable D-type flip flop circuit FF16 is illustrated in detail in FIG. 8, and comprises two memory loops 12a and 12b, and the memory loops 12a and 12b are respectively implemented by combination of an inverter IV11 and a NOR gate NR12 and combination of two inverters IV12 and IV13. The inverters IV11 and IV12 are of the three-state type, and each inverter IV11 or IV12 enters high-impedance state in response to logic "1" level at the control node thereof. A transfer gate TG12 is coupled between the input node D and the input node of the NOR gate NR12, and the output signal of the NOR gate NR11 is supplied to the other input node of the NOR gate NR12. The transfer gate TG12 and the inverter IV12 are responsive to the first clock signal CLK1, and the first clock signal CLK1 allows the transfer gate TG1 to turn on or the inverter IV12 to leave the high-impedance state. A three state inverter IV14 is coupled between the NOR gate NR12 of the two memory loops 12a and the inverter IV13 of the memory loop 12b, and the inverters IV11 and IV14 are responsive to the second clock signal CLK2. An inverter IV15 is further coupled between the inverter IV13 of the memory loop 12b and the output node Q, and an input signal is transferred from the input node D through the memory loops 12a and 12b to the output node Q while the low voltage level or logic "0" level is supplied to the other input node of the NOR gate NR12. Namely, when the first clock signal CLK1 goes up to a high voltage level corresponding to logic "1" level, the transfer gate TG12 turns on to relay a data bit to the memory loop 12a, and the data bit is latched by the memory loop 12a. After the first clock signal CLK1 is recovered to the low voltage level, the three state inverters IV11 and IV14 are released from the high-impedance state with the second clock signal CLK2, and the data bit is not only stored in the memory loop 12a but also transferred to the memory loop 12b. The data bit thus stored in the memory loop 12b is immediately supplied through the inverter IV15 to the output node Q thereof. Thus, the resettable D-type flip flop circuit FF16 latches a data bit in synchronism with the first clock signal CLK1, and delivers the data bit therefrom in synchronism with the second clock signal CLK2 in so far as the NOR gate NR12 is enabled. However, if the NOR gate NR12 is disabled, the NOR gate NR12 shifts the output signal thereof to logic "0" level or the low voltage level regardless of the data bit stored in the memory loop 12a, and any data bit is never transferred to the output node Q.

Turning back to FIG. 7, the pulse eliminating unit 13 comprises an AND gate AD13 coupled with the output nodes Q1 to Q4 of the D-type flip flop circuits FF12 to FF15, a NOR gate NR13 also coupled with the output nodes Q1 to Q4 of the D-type flip flop circuits FF12 to FF15, and an R-S flip flop circuit FF17 having a set node S coupled with the AND gate AD13 and a reset node R coupled with the NOR gate NR13. When the R-S flip flop circuit FF17 enters the set state, an output pulse is formed in an output pulse signal OUT11, and the output pulse is indicative of the input pulse remaining in the high voltage level over a predetermined time period seven times as long as the pulse-repetition period of either first or second clock signal tcyc. The R-S flip flop circuit FF17 is reset with the output signal of the NOR gate NR13. However, if an input pulse is recovered to the low voltage level before the predetermined time period is expired, the AND gate AD13 never shifts the output signal to the high voltage level, and any output pulse is formed in the output pulse signal OUT11.

Figure 9:
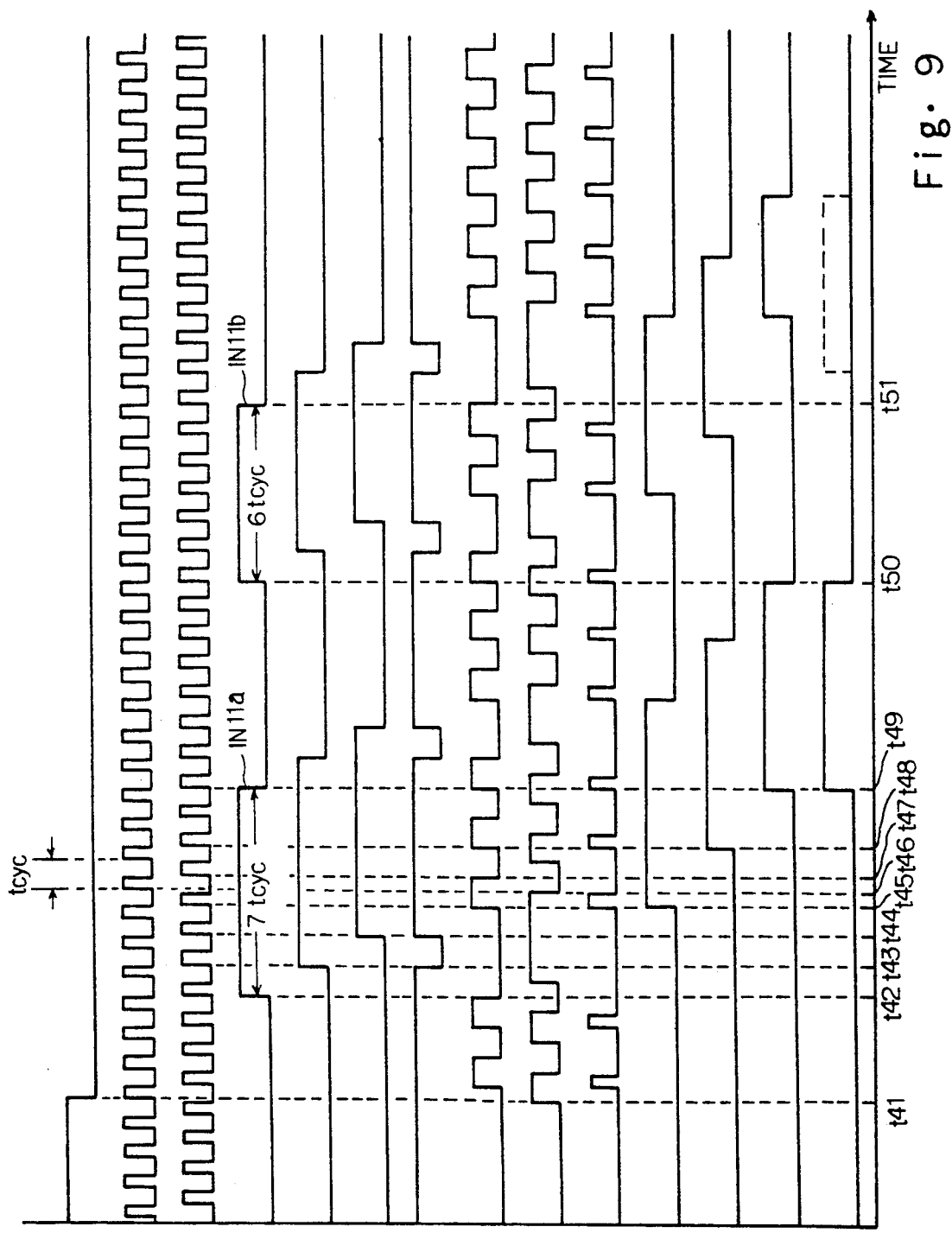
FIG. 9 is a timing chart showing the circuit behavior of the pulse discriminating circuit shown in FIG. 7.

Description is hereinbelow made on the circuit behavior of the pulse discriminating circuit shown in FIG. 7 with reference to FIG. 9 of the drawings. Assuming now that the reset signal RST is decayed to the active low voltage level at time t41, the NOR gate 11 becomes responsive to the output signal of the AND gate AD11. If a first input pulse IN11a of the input pulse signal IN11 rises at time t42, the first input pulse IN11a of logic "1" is latched by the D-type flip flop circuit FF11 in synchronism with the first clock signal CLK1, and is relayed to the output node Q0 in synchronism with the second clock signal CLK2 at time t42. Since the output node Q1 still remains in logic "0" level, the exclusive-NOR gate EX1 shifts the output signal thereof in logic "0" level at time t43, and the AND gate AD11 also keeps the output signal thereof in logic "0" level. The first input pulse IN11a is relayed to the output node Q1 of the D-type flip flop circuit FF12 at time t44, and, accordingly, the exclusive-NOR gate EX1 shifts the output signal thereof to logic "1" level. The output signal of the exclusive-NOR gate EX1 is latched by the resettable D-type flip flop circuit FF16 in synchronism with the first clock signal CLK1, and reaches the output node Q at time t45. Since the exclusive-NOR gate EX1 keeps the output signal thereof in logic "1" level, the AND gate AD11 shifts the output signal thereof to logic "1" level, and the AND gate AD12 produces the third clock signal CLK3 at time t45. With the third clock signal CLK3, the first input pulse IN11a is relayed to the output node Q2 of the D-type flip flop circuit FF13. However, the transfer gate TG11 transfers the output signal of logic "1" from the AND gate AD11 to the NOR gate NR11 at time t46, and the NOR gate NR11 shifts the output signal thereof to logic "0". Then, the resettable D-type flip flop circuit FF16 is reset, and the AND gate AD11 shifts the output signal thereof to logic "0" level at time t47. Then, the AND gate AD12 is never responsive to the second clock signal CLK2, and no third clock signal CLK3 is produced at time t47. Since the output signal of logic "0" level is transferred from the AND gate AD11 through the transfer gate TG11 to the NOR gate NR11 in synchronism with the first clock signal CLK1, the resettable D-type flip flop circuit FF16 is released from the reset state, and the AND gate AD12 produces the third clock signal CLK3 at time t48 through the similar sequence described hereinbefore. With the third clock signal CLK3, the first input pulse IN11a is relayed to the output node Q3 of the D-type flip flop circuit FF14, and is further relayed to the output node Q4 of the D-type flip flop circuit FF15 at time t49. At time t49, all of the output nodes Q1 to Q4 are in logic "1" level, and the R-S flip flop circuit AD13 enters the set state so that the output pulse signal OUT11 rises. The time period between times t42 to t49 is seven times as long as the pulse-repetition period tcyc, and the pulse discriminating circuit exactly discriminates the first input pulse IN11a.

However, if a second input pulse IN11b is six times as long as the pulse-repetition period tcyc, the output node Q4 rises after time t51, and the R-S flip flop circuit FF17 never enters the set state. Then, the output pulse signal OUT11 remains in the low voltage level, and the pulse discriminating circuit according to the present invention eliminates an output pulse corresponding to the second input pulse IN11b from the output pulse signal OUT11. In this instance, the predetermined time period is seven times as long as the pulse-repetition period tcyc.

As will be understood from the foregoing description, the predetermined time period seven times as wide as the pulse-repetition period tcyc is discriminated with only five D-type flip flop circuits FF11 to FF15, and each additional D-type flip flop circuit prolongs a unit time period twice as long as the pulse-repetition period tcyc. Therefore, the component element of the pulse discriminating circuit according to the present invention is less increasing rather than the prior art pulse discriminating circuit.

Although particular embodiments of the present invention have been shown and described, it will be obvious to those skilled in the art that various changes and modifications may be made without departing from the spirit and scope of the present invention. For example, the delay unit 12 may be implemented by flip flop circuits of a different type. Moreover, any type of divider is available for the pulse discriminating circuit according to the present invention.

What is claimed is:

1. A pulse discriminating circuit comprising
   a) a delay unit supplied with an input pulse signal consisting of input pulses for introducing predetermined time delay into propagation of each of said input pulses, and having early stages and later stages coupled in series for producing respective first output signals when said each of said input pulses takes place over said predetermined time delay, said early stages and said later stages being respectively responsive to combination of first and second clock signals complementary to each other and combination of said first clock signal and a third clock signal lower in frequency that said first and second clock signals,
   b) a pulse eliminating unit responsive to said first output signals for producing an output pulse forming a part of an output pulse signal, said pulse eliminating unit being prohibited from production of said output pulse in the absence of said first output signals, and
   c) a divider unit responsive to first output signals of said early stages selected from said first output signals and to said first and second clock signals for producing said third clock signal.

2. A pulse discriminating circuit as set forth in claim 1, in which said delay unit is implemented by a series combination of D-type flip flop circuits selectively serving as said early stages and said later stages.

3. A pulse discriminating circuit as set forth in claim 1, in which said pulse eliminating unit comprises a first AND gate having input nodes respectively coupled with output nodes of said D-type flip flop circuits serving as said later stages and an input node of one of said later stages coupled with an output node of one of said early stages, a first NOR gate having input nodes respectively coupled with the input nodes of said first AND gate, and an R-S flip flop circuit having a set node coupled with an output node of said first AND gate, a reset node coupled with an output node of said first NOR gate, and an output node where said output pulse signal takes place.

4. A pulse discriminating circuit as set forth in claim 1, in which said divider unit comprises an exclusive-NOR gate having input nodes coupled with output nodes of two of said D-type flip flop circuits serving as said early stages, a resettable D-type flip flop circuit having an input node coupled with an output node of said exclusive-NOR gate, first and second clock nodes respectively supplied with said first and second clock signals. a reset node, and an output node, a second AND gate having input nodes respectively coupled with said input node and said output node of said resettable D-type flip flop circuit, a first transfer gate coupled with an output node of said second AND gate, and responsive to said first clock signal for turning on, a second NOR gate having input nodes respectively coupled with said first transfer gate and a reset signal line, and a third AND gate having input nodes respectively supplied with the output signal of said second AND gate and said second clock signal for producing said third clock signal.

* * * * *

UNITED STATES PATENT AND TRADEMARK OFFICE
CERTIFICATE OF CORRECTION

PATENT NO. : 5,225,715
DATED : June 6, 1993
INVENTOR(S) : Takehiko, Mori, et al.

It is certified that error appears in the above-indentified patent and that said Letters Patent is hereby corrected as shown below:

Column 7, line 34, delete "EX1" and insert --EX11--.

Signed and Sealed this

Thirtieth Day of August, 1994

Attest:

BRUCE LEHMAN

Attesting Officer

Commissioner of Patents and Trademarks